United States Patent [19]

Hirashima

[11] Patent Number: 5,365,250

[45] Date of Patent: Nov. 15, 1994

[54] SEMICONDUCTOR DEVICE FOR DRIVING LIQUID CRYSTAL PANEL

[75] Inventor: Hiroyuki Hirashima, Kita-Katsuragi, Japan

[73] Assignee: Sharp Kabushiki Kaisha, Osaka, Japan

[21] Appl. No.: 944,119

[22] Filed: Sep. 10, 1992

[30] Foreign Application Priority Data

Sep. 10, 1991 [JP] Japan ................... 3-230286

[51] Int. Cl.⁵ .................. G09G 3/00; G01R 31/00
[52] U.S. Cl. .................. 345/94; 345/212; 345/904; 324/158.1
[58] Field of Search ............... 340/811, 813, 814, 784, 340/718, 663; 324/158 F, 158 R, 158 P; 371/22.5, 22.6, 27; 345/87, 94, 98, 99, 100, 211, 904

[56] References Cited

U.S. PATENT DOCUMENTS

| | | | |
|---|---|---|---|
| 4,177,519 | 12/1979 | Kasubuchi et al. | 340/718 |
| 4,848,876 | 7/1989 | Yamakawa | 340/813 |
| 4,918,385 | 4/1990 | Shreeve | 324/158 R |
| 4,956,605 | 9/1990 | Bickford et al. | 324/158 F |
| 5,063,304 | 11/1991 | Iyengar | 340/663 |
| 5,101,116 | 3/1992 | Morokawa | 340/811 |

*Primary Examiner*—Richard Hjerpe
*Assistant Examiner*—Steven J. Saras

[57] ABSTRACT

A semiconductor device for driving a liquid crystal panel includes an output unit for generating output signals to drive a liquid crystal panel, a terminal for supplying a voltage from a power supply in the outside of the device, a voltage changing unit connected to the terminal for changing the voltage through the terminal into a voltage necessary for a self burn-in test and for supplying the output unit with the changed voltage, and a control unit for controlling the output unit to conduct the self burn-in test when a predetermined control signal is applied thereto from the outside of the device.

6 Claims, 2 Drawing Sheets

SEMICONDUCTOR DEVICE FOR DRIVING LIQUID CRYSTAL PANEL

BACKGROUND OF THE INVENTION

1. Field of the Invention

The present invention relates to a semiconductor device for driving a liquid crystal panel, and more particularly to a semiconductor device for driving a liquid crystal panel including a self test circuit performing a so-called burn-in test in which a supply voltage is applied to the semiconductor device under high temperature condition.

2. Description of the Related Art

To assure the quality and reliability of semiconductor integrated circuits, it is generally necessary and indispensable to perform an accelerated life test under high temperature normally called burn-in in order to stabilize their characteristics and eliminate early failures, prior to actual use. The burn-in can remove semiconductor integrated circuits having inherent and latent defects, which will suffer faults occurring with passage of time or by applied stresses, because of the variance in manufacture or the like. Recently, various types of acceleration test such as static burn-in, dynamic burn-in and monitored burn-in have been introduced and put into practice with the developments of semiconductor integrated circuits having a number of pins, higher function, and larger scale.

In order to conduct such burn-in, generally, it is necessary to make ready sockets for accommodating semiconductor integrated circuits, a board for mounting those sockets, and an oven, or a pyrostat, for heating the semiconductor integrated circuits in sockets on the board and keeping them under high temperature. A semiconductor device for driving a liquid crystal panel which contains a self-burn-in circuit having functions necessary for the above-mentioned types of burn-in system is known.

FIG. 1 shows an example of such a semiconductor device for driving a liquid crystal panel containing a self burn-in circuit (not shown in FIG. 1). Such a self burn-in circuit may be provided with a pulse generator for imitating an operation of the device under actual use. The semiconductor device 20 is connected with a plurality of power supplies when a burn-in test is performed.

The semiconductor device 20 for driving a liquid crystal panel (not shown in FIG. 1) includes a self-burn-in circuit, a liquid crystal drive output unit 21, terminals 22 and 23 through which given powers are supplied respectively for an ordinary operation and burn-in, and a terminal 24 through which a drive output is supplied to the liquid crystal panel.

Power supplies 31, 32, 33, and 34 necessary to drive liquid crystals for the burn-in test are connected to the terminals 22, and a power supply 35 for logic operations is connected to the terminal 23. The liquid crystal drive power supplies 31, 32, 33, and 34 provide different voltages of V0, V1, V2, V3, and VL, which are applied to the liquid crystal panel drive output unit 21 for a burn-in operation.

In a burn-in test on a semiconductor device for driving a liquid crystal panel, it is generally desirable to conduct the test by the easiest possible method for the purpose of a higher throughput in mass-production.

However, in a conventional semiconductor device for driving a liquid crystal panel as was mentioned above, there has been a problem that many types of power supplies need to be provided and connected, a fact which reduces the mass-production throughput and entails a great cost for the test.

SUMMARY OF THE INVENTION

It is therefore an object of the present invention to provide a semiconductor device for driving a liquid crystal panel capable of improving a throughput in mass-production and reducing the cost of a burn-in test.

In order to achieve the above object, a semiconductor device including a self burn-in test circuit for driving a liquid crystal panel comprises an output unit for generating output signals to drive a liquid crystal panel, a terminal for supplying a voltage from a power supply in the outside of the device, a voltage changing unit connected to the terminal for changing the voltage through the terminal into a voltage necessary for a self burn-in test and for supplying the output unit with the changed voltage, and a control unit for controlling the output unit to conduct the self burn-in test when a predetermined control signal is applied thereto from the outside of the device.

In a burn-in operation, the terminal is supplied with a voltage from the power supply in the outside of the semiconductor device and the voltage is changed into a voltage necessary for a self burn-in test by the voltage changing unit. Then the changed voltage is applied to the output unit. The voltage may be raised or/and lowered by the voltage changing unit to provide various voltages necessary for burn-in. In a preferred embodiment, the voltage changing unit includes a unit for raising the voltage supplied through the terminal into a higher voltage necessary for the self burn-in test and a unit for lowering the voltage through the terminal into a lower voltage necessary for the self burn-in test.

When the control signal is applied thereto, the control unit controls the output unit to perform the self burn-in test in cooperation with the voltage changing unit.

The semiconductor device according to the present invention can perform the self burn-in test using a single power supply. Therefore, it is not necessary to provide and connect a plurality of external power supplies as in the known art, so that burn-in can be performed by a simple and easy method.

Further objects and advantages of the present invention will be apparent from the following description of the preferred embodiments of the invention as illustrated in the accompanying drawings.

DESCRIPTION OF THE PREFERRED EMBODIMENTS

An embodiment of the present invention will be described with reference to the accompanying drawings.

Figure 1:
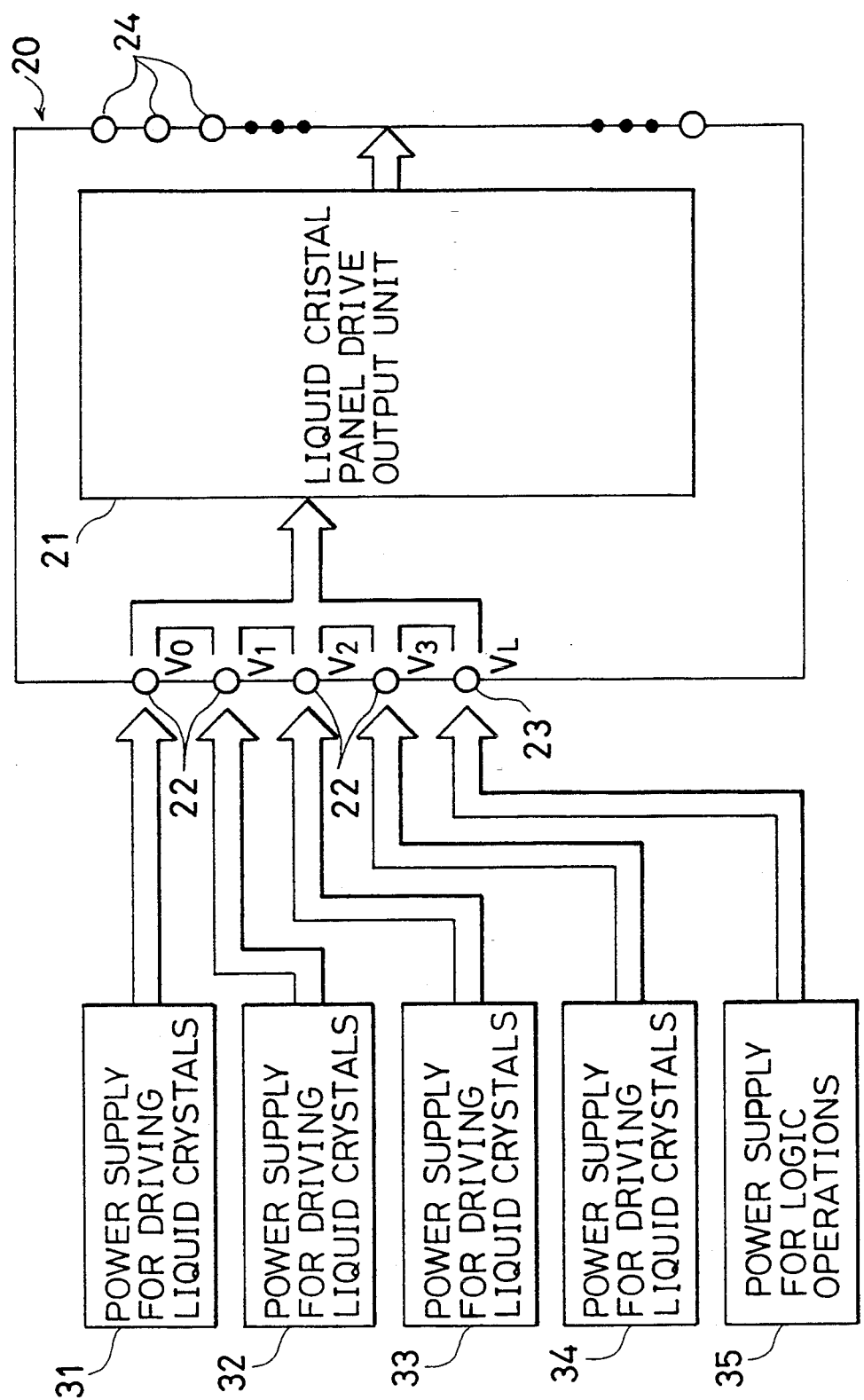
FIG. 1 is a block diagram of the conventional semiconductor device for driving a liquid crystal panel.
Figure 2:
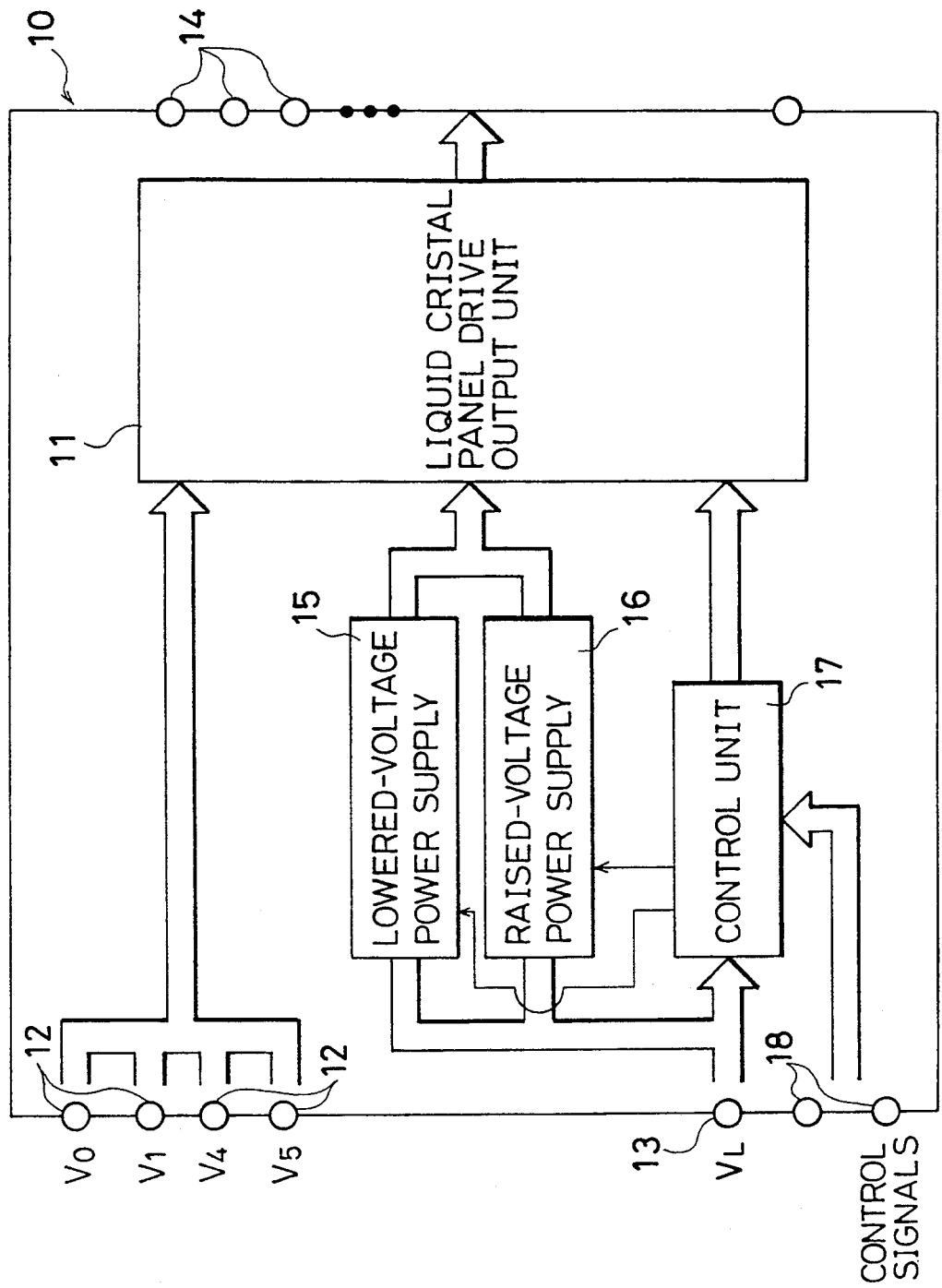
FIG. 2 is a block diagram of the semiconductor device for driving a liquid crystal panel according to an embodiment of the present invention.

FIG. 2 is a block diagram schematically showing a structure of the semiconductor device for driving a liquid crystal panel according to an embodiment of the present invention.

In FIG. 2, a semiconductor device 10 for driving a liquid crystal panel containing a self-burn-in circuit includes a liquid crystal panel drive output unit 11, terminals 12 for supplying a power under ordinary operation, a terminal 13 for supplying a power under ordinary operation and a burn-in test, and a terminal 14 for supplying a liquid crystal panel (not shown in FIG. 2) with a drive output.

The semiconductor device 10 for driving a liquid crystal panel further includes a lowered-voltage power supply 15 and a raised-voltage power supply 16, a control unit 17, and terminals 18 for receiving control signals.

The lowered-voltage power supply 15 is so arranged that on receiving a voltage VL from the terminal 18 from a power supply for logic operations, the voltage VL it lowered to supply the liquid crystal panel drive output unit 11 with the lower voltage for driving liquid crystals which the liquid crystal panel drive output unit 11 requires. On the other hand, the raised-voltage power supply 16 is so arranged that on receiving the voltage VL from the terminal 18 from the power supply for logic operations, the voltage VL is raised to supply the liquid crystal panel drive output unit 11 with the higher voltage for driving the liquid crystals which the liquid crystal panel drive output unit 11 requires. When the control unit 17 receives a control signal from outside through the terminal 18, the liquid crystal panel drive output unit 11 performs a specified burn-in in cooperation with the lowered-voltage power supply 15 and the raised-voltage power supply 16. The control unit 17 controls the lowered-voltage power supply 15 and the raised-voltage power supply 16 so that they supply the drive output unit 11 with predetermined and constant powers. Preferably, the control unit 17 includes a pulse generator for supplying a pulse to the drive output unit 11 to imitate an operation of the semiconductor device under actual use.

Under the arrangement mentioned above, in burn-in of the semiconductor device 10 for driving a liquid crystal panel according to the present embodiment only by applying a logic operation power supply of 5 V (voltage VL), for example, various voltages necessary for burn-in different from the 5 V can be generated within the semiconductor device 10 by the lowered-voltage power supply 15 and the raised-voltage power supply 16, so that a specified burn-in can be performed on the liquid crystal panel drive output unit 11 under a normal operation condition.

As has been described, in this embodiment, since the semiconductor device for driving a liquid crystal panel includes the lowered-voltage power supply and the raised-voltage power supply and therefore the necessary voltages for the liquid crystal panel drive output unit are generated using only a single power supply for logic operations. As a result, it is not necessary to provide and connect a plurality of power supplies as in the known art, so that burn-in can be performed in a simple and easy way, which is a great advantage offered by the present embodiment.

Many widely varied embodiments of the present invention may be constructed without departing from the spirit and the scope of the present invention and the present invention is not limited to the specific embodiments described in the specification, except as defined in the appended claims.

What is claimed is:

1. A semiconductor device for driving a liquid crystal panel, comprising:
    output means for generating output signals to drive said liquid crystal panel;
    a power supply terminal for supplying a predetermined constant voltage from a power supply outside of said liquid crystal panel;
    a control terminal for receiving a first control signal for controlling a self burn-in test;
    voltage changing means connected to said power supply terminal for changing said predetermined constant voltage supplied via said power supply terminal into a desired voltage necessary for said self burn-in test in response to a second control signal; and
    control means connected to said power supply terminal, said control terminal and said voltage changing means for generating said second control signal controlling said voltage changing means to generate said desired voltage for said self burn-in test in response to said first control signal so that said output means conducts said self burn-in test.

2. A semiconductor device according to claim 1, wherein said voltage changing means includes means for raising said predetermined constant voltage into a higher voltage and means for lowering said predetermined constant voltage into a lower voltage.

3. A semiconductor device according to claim 1, wherein said control means includes means for controlling said voltage changing means to supply said output means with said predetermined constant voltage.

4. A semiconductor device according to claim 1, wherein said control means further includes means connected to said output means for generating and supplying a pulse signal to imitate an operation of the semiconductor device under an actual use condition.

5. A semiconductor device according to claim 2, wherein said control means further includes means connected to said output means for generating and supplying a pulse signal to imitate an operation of the semiconductor device under an actual use condition.

6. A semiconductor device according to claim 3, wherein said control means further includes means connected to said output means for generating and supplying a pulse signal to imitate an operation of the semiconductor device under an actual use condition.

* * * * *